United States Patent
Kitaji

(10) Patent No.: US 12,000,897 B2
(45) Date of Patent: Jun. 4, 2024

(54) POWER MANAGEMENT APPARATUS, POWER MANAGEMENT SYSTEM AND POWER MANAGEMENT METHOD

(71) Applicant: KYOCERA CORPORATION, Kyoto (JP)

(72) Inventor: Mitsuhiro Kitaji, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 522 days.

(21) Appl. No.: 17/285,092

(22) PCT Filed: Oct. 11, 2019

(86) PCT No.: PCT/JP2019/040198
§ 371 (c)(1),
(2) Date: Apr. 14, 2021

(87) PCT Pub. No.: WO2020/080284
PCT Pub. Date: Apr. 23, 2020

(65) Prior Publication Data
US 2021/0349151 A1 Nov. 11, 2021

(30) Foreign Application Priority Data
Oct. 15, 2018 (JP) .................. 2018-194125

(51) Int. Cl.
*G01R 31/374* (2019.01)
*G01R 31/392* (2019.01)
*H02J 3/32* (2006.01)

(52) U.S. Cl.
CPC ......... *G01R 31/374* (2019.01); *G01R 31/392* (2019.01); *H02J 3/32* (2013.01)

(58) Field of Classification Search
CPC ....... G01R 31/374; G01R 31/392; H02J 3/32; H02J 7/0048; H02J 7/005; G06Q 10/06315; G06Q 50/06
See application file for complete search history.

(56) References Cited

U.S. PATENT DOCUMENTS 7,640,443 B2 * 12/2009 Fujimoto .............. G06F 1/3221
709/201
9,812,871 B2 11/2017 Sakuma et al.
(Continued)

FOREIGN PATENT DOCUMENTS

JP 2015116094 A 6/2015
JP 2017112655 A 6/2017
(Continued)

OTHER PUBLICATIONS

WO-2013128727-A1 (English version), Sep. 6, 2013, 17 pp. (Year: 2013).*
(Continued)

*Primary Examiner* — Tung S Lau
(74) *Attorney, Agent, or Firm* — HAUPTMAN HAM, LLP

(57) ABSTRACT

A power management apparatus includes a manager configured to manage a utilization state of an electric storage apparatus and a controller configured to execute a balance control of the electric storage apparatus such that a power of one or more facilities becomes close to a target power. The controller is configured to compare a first effect and a second effect, the first effect being produced by operating the electric storage apparatus, the second effect being produced by not operating the electric storage apparatus, and not to execute the balance control in a case where the second effect
(Continued)

is higher than the first effect, and to execute the balance control in a case where the first effect is higher than the second effect.

12 Claims, 4 Drawing Sheets

(56)  References Cited

U.S. PATENT DOCUMENTS

| | | |
|---|---|---|
| 2009/0271645 A1* | 10/2009 | Mori ............... G06F 3/0689 |
| | | 713/320 |
| 2011/0283123 A1* | 11/2011 | Shigemura ........... G06F 3/0634 |
| | | 713/320 |
| 2015/0012150 A1 | 1/2015 | Sakuma et al. |
| 2017/0170684 A1 | 6/2017 | Matthey |
| 2018/0041045 A1 | 2/2018 | Sakuma et al. |
| 2018/0269541 A1 | 9/2018 | Kobayashi et al. |

FOREIGN PATENT DOCUMENTS

| | | | |
|---|---|---|---|
| WO | 2013128727 A1 | 9/2013 | |
| WO | WO-2013128727 A1 * | 9/2013 | ............ H01M 10/48 |

OTHER PUBLICATIONS

Takanokura et al., Energy Management with Battery System for Smart City, Jul. 28-30, 2014, Proceedings of the 33rd Chinese Control Conference, Nanjing, China, pp. 8200-8203 (Year: 2014).*

* cited by examiner

FIG. 4

| EFFECT | PARAMETER |
|---|---|
| FIRST EFFECT | SUPPRESSION RATE |
| SECOND EFFECT | DETERIORATION PARAMETER, INTRODUCTION COST |

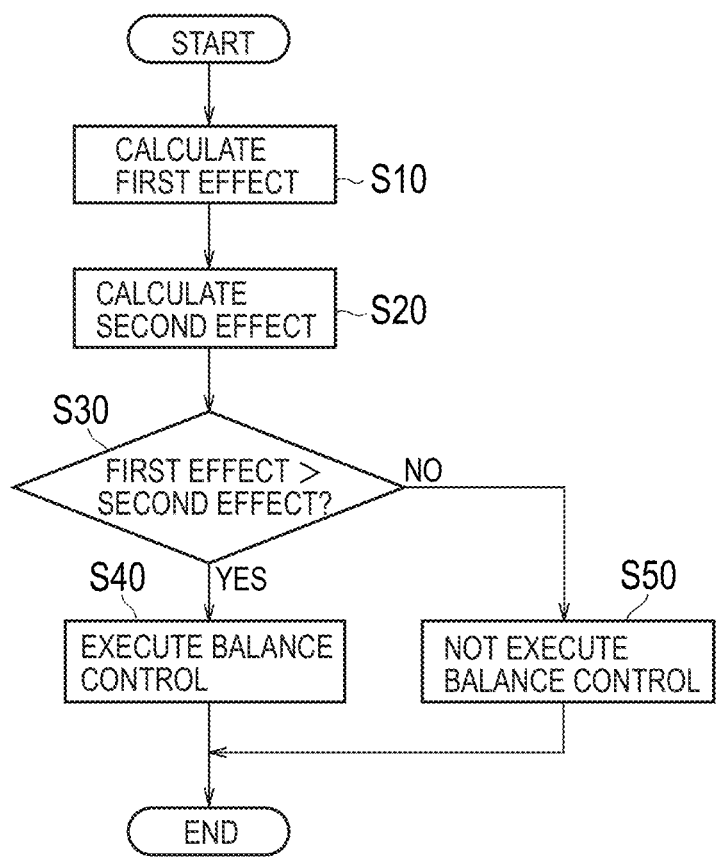

POWER MANAGEMENT APPARATUS, POWER MANAGEMENT SYSTEM AND POWER MANAGEMENT METHOD

RELATED APPLICATIONS

The present application is a National Phase of International Application No. PCT/JP2019/040198, filed Oct. 11, 2019, which claims priority based on Japanese Patent Application No. 2018-194125, filed Oct. 15, 2018 and the entire contents thereof are incorporated in the present specification.

TECHNICAL FIELD

The present invention relates to a power management apparatus, a power management system and a power management method.

BACKGROUND ART

In recent years, there has been proposed a scheme in which a business operator such as a resource aggregator manages a power of facilities. The power of the facilities includes a power (power of forward power flow) from a power grid to a facility and a power (power of reverse power flow) from a facility to a power grid.

In this case, when the demand and supply balance of the power managed by the business operator is lost, an entity (for example, an electric power company) different from the business operator maintains the demand and supply balance. The business operator pays a penalty associated with the maintenance of the demand and supply balance.

For realizing the above-described scheme, there has been proposed a technology (for example, virtual power plant (VPP)) in which an electric storage apparatus is used as a distributed power supply (for example, Patent Literature 1).

CITATION LIST

Patent Literature

Patent Literature 1: Japanese Application Publication No. 2015-116094

SUMMARY OF INVENTION

A power management apparatus according to a first feature includes—a manager configured to manage at least a utilization state of an electric storage apparatus; and a controller configured to execute a balance control of the electric storage apparatus such that a power of one or more facilities becomes close to a target power. The controller is configured to compare a first effect and a second effect, the first effect being produced by operating the electric storage apparatus, the second effect being produced by not operating the electric storage apparatus, and not to execute the balance control in a case where the second effect is higher than the first effect, and to execute the balance control in a case where the first effect is higher than the second effect.

A power management system according to a second feature includes: a manager configured to manage at least a utilization state of an electric storage apparatus; and a controller configured to execute a balance control of the electric storage apparatus such that a power of one or more facilities becomes close to a target power. The controller is configured to compare a first effect and a second effect, the first effect being produced by operating the electric storage apparatus, the second effect being produced by not operating the electric storage apparatus, and not to execute the balance control in a case where the second effect is higher than the first effect, and to execute the balance control in a case where the first effect is higher than the second effect.

A power management method according to a third feature includes the steps of: managing at least a utilization state of an electric storage apparatus; comparing a first effect and a second effect, the first effect being produced by operating the electric storage apparatus, the second effect being produced by not operating the electric storage apparatus; and not executing a balance control of the electric storage apparatus such that a power of one or more facilities becomes close to a target power, in a case where the second effect is higher than the first effect, and executing the balance control in a case where the first effect is higher than the second effect.

BRIEF DESCRIPTION OF DRAWINGS

FIG. 4 is a diagram illustrating a first effect and a second effect according to the embodiment.

FIG. 5 is a diagram illustrating a power management method according to the embodiment.

DESCRIPTION OF EMBODIMENTS

Figure 1:
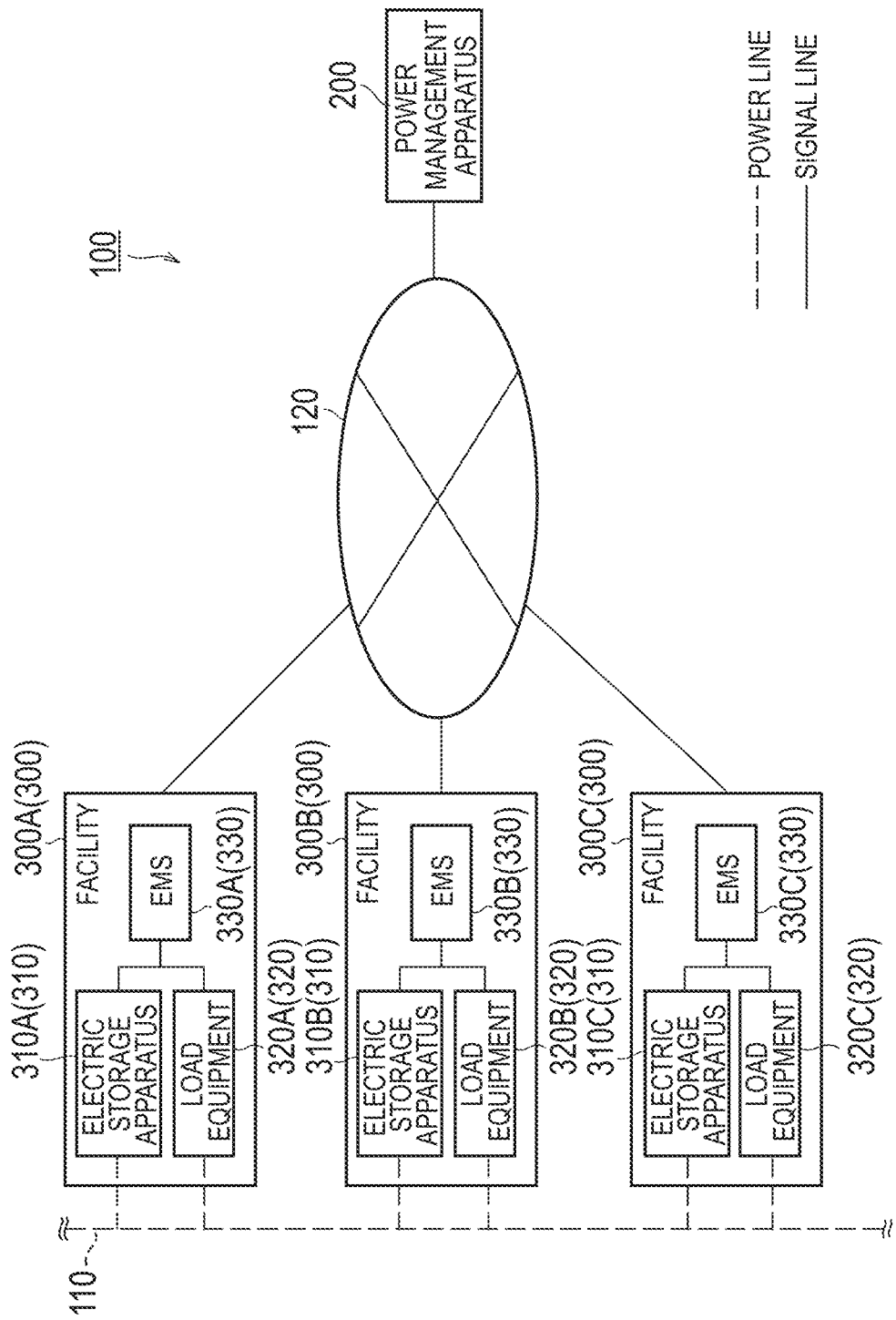
FIG. 1 is a diagram illustrating a power management system 100 according to an embodiment.

An introduction cost is necessary for the introduction of an electric storage apparatus, and meanwhile the electric storage apparatus is deteriorated by the charge or discharge of the electric storage apparatus. Accordingly, even when the electric storage apparatus is controlled in consideration of an imbalance rate, there is a possibility that the effect associated with the introduction of the electric storage apparatus is not obtained.

Hence, the present invention has been made for solving the above-described problem, and makes it possible to optimize the effect associated with the introduction of the electric storage apparatus.

Hereinafter, an embodiment will be described with reference to the drawings. In the following description about the drawings, the same or similar parts are denoted by the same or similar reference numerals.

In this regard, it should be born in mind that the drawings are schematic, and a ratio of each dimension is different from actual one. Therefore, each specific dimension needs to be decided in view of the following description. Of course, the drawings naturally includes portions having different dimensional relationships or ratios.

EMBODIMENT

Power Management System

Hereinafter, the power management system according to the embodiment will be described.

As illustrated FIG. 1, a power management system 100 includes a power management apparatus 200 and facilities 300. In FIG. 1, as the facilities 300, facilities 300A-300C are exemplified.

Each facility 300 is connected to a power grid 110. Hereinafter, a flow of power from the power grid 110 to the facility 300 will be referred to as a forward power flow, and a flow of power from the facility 300 to the power grid 110 will be referred to as a reverse power flow.

The power management apparatus 200 and the facilities 300 are connected to a network 120. The network 120 only has to provide lines between the power management apparatus 200 and the facilities 300. For example, the network 120 may be the internet. The network 120 may be a dedicated line such as a virtual private network (VPN).

The power management apparatus 200 is an apparatus that is managed by a business operator that manages at least an electric storage apparatus 310. The power management apparatus 200 may be an apparatus that is managed by a business operator such as a power generation operator, a power distribution operator, a retailer and a resource aggregator. The resource aggregator is a power operator that provides a power of reverse power flow to a power generation operator, a power distribution operator, a retailer and the like in a virtual power plant (VPP). The resource aggregator may be a power operator that generates a surplus power (negawatt power) by reduction in the consumed power of the facility 300 that is managed by the resource aggregator. The surplus power may be regarded as a generated power. The resource aggregator may be a power operator that absorbs an excess power by increase (for example, increase in the charge amount of a storage battery apparatus) in the consumed power of the facility 300 that is managed by the resource aggregator.

The power management apparatus 200 may transmit a control message for giving an instruction of a control of the electric storage apparatus 310 provided in the facility 300, to an EMS 330 provided in the facility 300. For example, the power management apparatus 200 may transmit a forward power flow control message (for example, demand response (DR)) for requiring a control of forward power flow, and may transmit a reverse power flow control message for requiring a control of reverse power flow. The power management apparatus 200 may transmit a power supply control message for controlling an operating state of a distributed power supply. The degree of the control of the forward power flow or the reverse power flow may be represented by an absolute value (for example, OO kW), or may be represented by a relative value (for example, OO %). Alternatively, the degree of the control of the forward power flow or the reverse power flow may be represented by two or more levels. The degree of the control of the forward power flow or the reverse power flow may be represented by a power rate (real time pricing (RTP)) defined by the current power demand and supply balance, or may be represented by a power rate (time of use (TOU)) defined by the past power demand and supply balance.

The facility 300 includes the electric storage apparatus 310, load equipment 320 and the EMS 330.

The electric storage apparatus 310 is a distributed power supply that performs the charge of power and the discharge of power. For example, the electric storage apparatus 310 is constituted by a PCS (Power Conditioning System) and a storage battery cell.

The load equipment 320 is equipment that consumes power. For example, the load equipment 320 is air conditioning equipment, lighting equipment, AV (Audio Visual) equipment, or the like.

The EMS 330 is an apparatus (energy management system (EMS)) that manages the power of the facility 300. The EMS 330 may control the operating states of the electric storage apparatus 310 and the load equipment 320. The EMS 330 is an example of a virtual end node (VEN).

The EMS 330 transmits a message including an information element indicating a utilization state of the electric storage apparatus 310, to the power management apparatus 200. The utilization state of the electric storage apparatus 310 is used for specifying a deterioration state (state of health (SOH)) of the electric storage apparatus 310. The information element indicating the utilization state of the electric storage apparatus 310 may include an information element indicating the current capacity (for example, an AC effective capacity (charge) or an AC effective capacity (discharge)) of the electric storage apparatus 310, or may include an information element indicating the current resistance value of the electric storage apparatus 310. The information element indicating the utilization state of the electric storage apparatus 310 may include an information element indicating an accumulated charge time and accumulated discharge time of the electric storage apparatus 310, or may include an information element (for example, an AC integral charge power amount measurement value, an AC instantaneous charge power amount measurement value, a DC integral charge power amount measurement value, a DC instantaneous charge power amount measurement value, an integral charge power amount measurement value, an instantaneous charge power measurement value and/or an instantaneous charge voltage measurement value) indicating an accumulated charge amount of the electric storage apparatus 310, and an information element (for example, an AC integral discharge power amount measurement value, an AC instantaneous discharge power amount measurement value, a DC integral discharge power amount measurement value, a DC instantaneous discharge power amount measurement value, an integral discharge power amount measurement value, an instantaneous discharge power measurement value and/or an instantaneous discharge voltage measurement value) indicating an accumulated discharge amount. The information element indicating the utilization state of the electric storage apparatus 310 may include an information element indicating an accumulated charge-discharge cycle number of the electric storage apparatus 310.

For example, the SOH of the electric storage apparatus 310 may be actually measured based on SOH=(current capacity/initial capacity)×100, or may be actually measured based on SOH=(current resistance value/initial resistance value)×100. The SOH may be actually measured by executing a maintenance mode with a predetermined period (for example, 1 time/2 years).

For example, the SOH of the electric storage apparatus 310 may be estimated based on {(capacity t1−deterioration capacity)/initial capacity}×100. The capacity t1 is a capacity that is actually measured in the maintenance mode executed at a timing t1. The deterioration capacity is estimated based on the discharge amount and charge amount between the timing t1 and the current timing×1-kWh deterioration rate. The 1-kWh deterioration rate can be specified based on a guaranteed deterioration rate of the electric storage apparatus 310. For example, in the case of an electric storage apparatus 310 in which a deterioration rate of 20% is guaranteed in 6000 charge-discharge cycles, the 1-kWh deterioration rate may be shown as ⅕₆₀₀.

In the following, the actually measured SOH and the estimated SOH are also referred to as SOH with no particular distinction.

In the embodiment, communication between the power management apparatus 200 and the EMS 330 may be performed according to a first protocol. Meanwhile, communication between the EMS 330 and the electric storage apparatus 310 or the load equipment 320 may be performed according to a second protocol that is different from the first protocol. For example, a protocol conforming to open automated demand response (Open ADR) or an original dedicated protocol can be used as the first protocol. For example, a protocol conforming to ECHONET Lite, SEP (Smart Energy Profile) 2.0, KNX or an original dedicated protocol can be used as the second protocol. The first protocol and the second protocol only have to be different, and for example, both may be original dedicated protocols if they are created along different rules.

Power Management Apparatus

Figure 2:
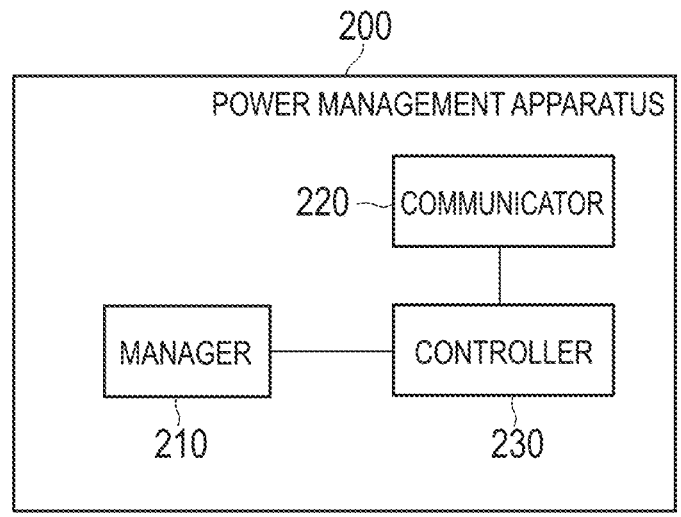
FIG. 2 is a diagram illustrating a power management apparatus 200 according to the embodiment.

The power management apparatus according to the embodiment will be described below. As illustrated in FIG. 2, the power management apparatus 200 includes a manager 210, a communicator 220 and a controller 230. The power management apparatus 200 is an example of a virtual top node (VTN).

The manager 210 is constituted by a storage medium including a memory such as a non-volatile memory, and/or a hard disc drive (HDD). The manager 210 can be constituted by any other electric storage apparatus, and for example, the manager 210 may be an optical electric storage apparatus such as an optical disc, or may be a magneto optical disc or the like.

The manager 210 stores data regarding the facility 300 that is managed by the power management apparatus 200. The facility 300 that is managed by the power management apparatus 200 may be a facility 300 that has a contract with a power operator. For example, the data regarding the facility 300 may be a demand power that is supplied from a power grid 110 to the facility 300. The data regarding the facility 300 may be data (an identification number, a maker code, a product code and/or a manufacturing number) indicating the type of the electric storage apparatus 310 that is provided in the facility 300. The data regarding the facility 300 may be specifications and others of the electric storage apparatus 310 that is provided in the facility 300. The specifications may be the initial capacity (W) and initial resistance value (Ω) of the electric storage apparatus 310. The specifications may be specified based on the type of the electric storage apparatus 310.

In the embodiment, the manager 210 manages at least the utilization state of the electric storage apparatus 310. The utilization state of the electric storage apparatus 310 may be specified based on a message that is received from the EMS 330. In the case where the power management apparatus 200 directly controls the operation of the electric storage apparatus 310 without depending on the EMS 330, the utilization state of the electric storage apparatus 310 may be specified based on a control history of the operation of the electric storage apparatus 310.

The communicator 220 is constituted by a communication module. The communication module may be a radio communication module conforming to standards such as IEEE802.11a/b/g/n, ZigBee, Wi-SUN, or may be a wire communication module conforming to standards such as IEEE802.3. The communicator 220 performs communication with each facility 330 (EMS 330). For example, the communicator 220 receives the message including the information element indicating the utilization state of the electric storage apparatus 310, from the EMS 330.

The controller 230 may include at least one processor. In various embodiments, the at least one processor may be realized as a single integrated circuit (IC), or as a plurality of integrated circuits (IC) and/or discrete circuits connected in a communicable manner. The controller 230 controls each constituent that is provided in the power management apparatus 200.

In the embodiment, the controller 230 executes a balance control of controlling the operation of the electric storage apparatus 310 such that the power of one or more facilities 300 becomes close to a target power. The operation of the electric storage apparatus 310 includes a discharge of the electric storage apparatus 310, a charge of the electric storage apparatus 310, and/or a wait of the electric storage apparatus 310.

The target power may be configured based on a peak power that is permitted for the one or more facilities 300. The peak power that is permitted for the one or more facilities 300 may be previously determined by a contract between an entity (hereinafter, referred to as an upper entity (for example, an electric power company)) different from a business operator (hereinafter, referred to as an administration business operator) that manages the power management apparatus 200 and the administration business operator. In the case where the total power of the one or more facilities 300 exceeds the peak power, the administration business operator pays a penalty to the upper entity. For example, the penalty may be money, or may be cost-free power supply.

The target power may be configured based on at least one of a reduction request for a power of forward power flow to the one or more facilities 300 and a reduction request for a power of reverse power flow from the one or more facilities 300. The reduction request for the forward power flow amount may be transmitted from the above-described upper entity to the power management apparatus 200. Similarly, the reduction request for the reverse power flow amount may be transmitted from the upper entity to the power management apparatus 200. In the case where the administration business operator reduces the power of forward power flow or the power of reverse power flow in response to the reduction request, the administration business operator acquires an incentive from the upper entity. The incentive may be money, or may be cost-free power supply.

The target power may be configured by a previously determined imbalance plan. The imbalance plan may be determined by the contract between the upper entity and the administration business operator. For example, the administration business operator may design the imbalance plan, and the upper entity may give approval to the designed imbalance plan. The imbalance plan includes a change (hereinafter, referred to as an imbalance power) in the target power along a time axis. In the case where the total power of the one or more facilities 300 deviates from the imbalance power by a predetermined percentage (for example, ±3%) or more, the administration business operator pays a penalty to the upper entity. For example, the penalty may be money, or may be cost-free power supply.

Under such premises, the controller 230 compares a first effect that is produced by operating the electric storage apparatus 310 and a second effect that is produced by not operating the electric storage apparatus 310. The controller 230 does not execute the balance control in the case where the second effect is higher than the first effect, and executes the balance control in the case where the first effect is higher than the second effect. Details of the first effect and the second effect will be described later (see FIG. 4).

Capacity of Electric Storage Apparatus

The capacity of the electric storage apparatus according to the embodiment will be described below.

Figure 3:
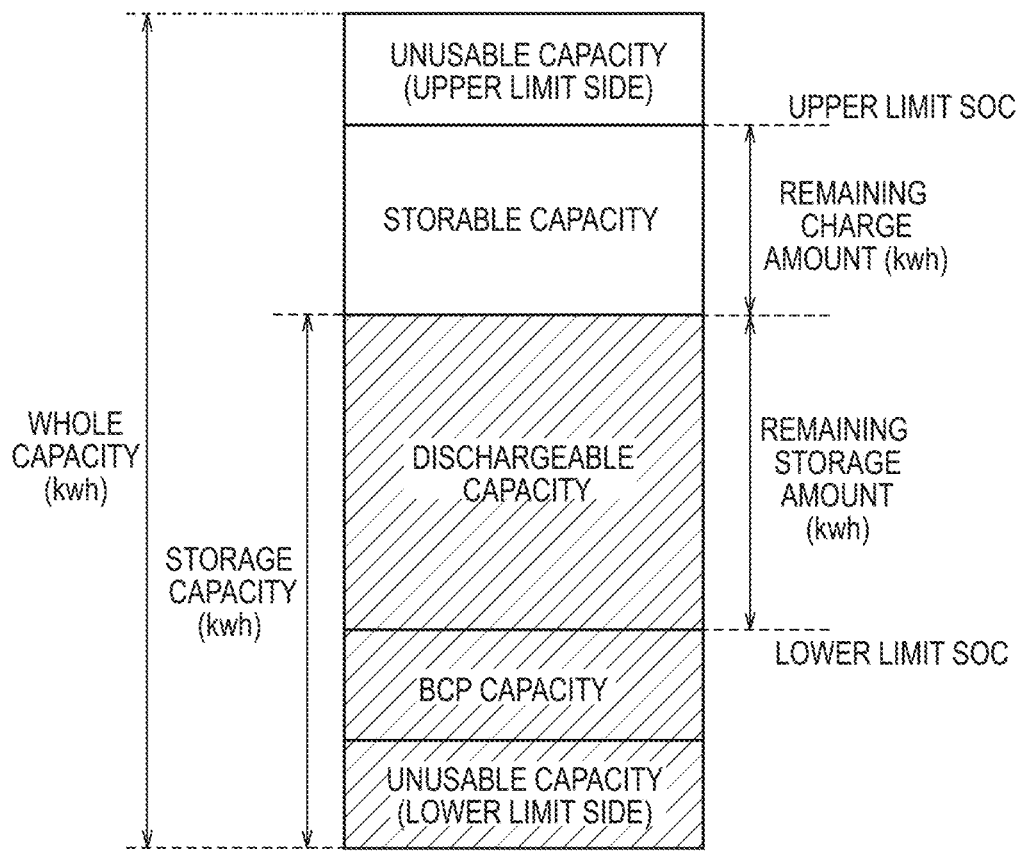
FIG. 3 is a diagram for describing the capacity of an electric storage apparatus 310 according to the embodiment.

As illustrated in FIG. 3, in the whole capacity of the electric storage apparatus 310, a lower limit state of charge (SOC) and an upper limit SOC are determined. The lower limit SOC is configured to a first remaining amount, and the upper limit SOC is configured to a second remaining amount that is a remaining storage amount higher than the first remaining amount. Furthermore, the whole capacity of the electric storage apparatus 310 includes an unusable capacity (lower limit side) for protecting the electric storage apparatus 310 and an extraordinary (business continuity plan (BCP)) capacity for coping with an emergency event such as a disaster. The lower limit SOC is determined such that the remaining storage amount does not fall below the BCP capacity and the unusable capacity (lower limit side). For example, the lower limit SOC is the total value of the BCP capacity and the unusable capacity (lower limit side). The upper limit SOC is determined such that the storage capacity does not reach an unusable capacity (upper limit side). For example, the upper limit SOC is a value resulting from subtracting the unusable capacity (upper limit side) from the whole capacity. Under such premises, a remaining storage amount (dischargeable capacity) that can be discharged by the electric storage apparatus 310 is a value resulting from subtracting the lower limit SOC from the storage capacity. A remaining charge amount (chargeable capacity) that can be charged by the electric storage apparatus 310 is a value resulting from subtracting the storage capacity from the upper limit SOC.

Details of First Effect and Second Effect

Details of the first effect and the second effect according to the embodiment will be described below.

First, the first effect will be described. As described above, the first effect is an effect that is produced by operating the electric storage apparatus 310. As illustrated in FIG. 4, the power management apparatus 200 (controller 230) calculates the first effect based on the incentive that is obtained by the operation of the electric storage apparatus 310 or the penalty that is avoided by the operation of the electric storage apparatus 310. The incentive or the penalty is calculated based on the difference between the power of the one or more facilities 300 and the target power, which is a difference that is realized by operating the electric storage apparatus 310.

For example, in the case where the target power is configured based on the peak power, the penalty can be decreased by the discharge of the electric storage apparatus 310. In the case where the target power is configured based on the reduction request for the power of forward power flow, the incentive can be increased by the discharge of the electric storage apparatus 310. In the case where the target power is configured based on the reduction request for the power of reverse power flow, the incentive can be increased by the charge of the electric storage apparatus 310. In the case where the target power is configured based on the imbalance plan, the penalty can be decreased by the discharge of the electric storage apparatus 310 or the charge of the electric storage apparatus 310. In other words, the first effect may be regarded as an incentive that is acquired by the operation of the electric storage apparatus 310, and may be regarded as a penalty that is avoided by the operation of the electric storage apparatus 310.

Second, the second effect will be described. As described above, the second effect is an effect that is produced by not operating the electric storage apparatus 310. As illustrated in FIG. 4, the power management apparatus 200 (controller 230) calculates the second effect based on a deterioration parameter associated with the charge or discharge of the electric storage apparatus 310 and an introduction cost for the electric storage apparatus 310. Specifically, the power management apparatus 200 (controller 230) calculates a deterioration cost for the electric storage apparatus 310 that is produced by the operation of the electric storage apparatus 310, based on the introduction cost and the deterioration parameter. In other words, the second effect may be regarded as a deterioration cost that is avoided by not operating the electric storage apparatus 310.

For example, the introduction cost may include a purchase cost for the electric storage apparatus 310, may include an installation cost for the electric storage apparatus 310, and may include an operation cost for the electric storage apparatus 310. The deterioration parameter is a parameter indicating the deterioration rate of the electric storage apparatus 310 that is produced by the operation of the electric storage apparatus 310. The deterioration rate may be a rate at which the electric storage apparatus 310 is deteriorated by the discharge and charge in one cycle.

For example, a case where the electric storage apparatus 310 has a cycle life property in which the capacity of the electric storage apparatus 310 is decreased to 50% in 1000 cycles and the introduction cost is 1000000 yen will be exemplified. In this case, the deterioration rate in one cycle can be shown as 50/1000=0.05, and the deterioration cost in one cycle can be shown as 1000000 yen×0.05=500 yen. The deterioration rate may be the decrease rate of the SOH that is produced by the operation of the electric storage apparatus 310.

The deterioration rate may be corrected based on the charge state (SOC: State Of Charge) of the electric storage apparatus 310. The deterioration rate may be corrected so as to increase as the SOC is higher.

The deterioration rate may be corrected based on the temperature of the electric storage apparatus 310. The deterioration rate may be corrected so as to increase as the temperature of the electric storage apparatus 310 is higher. The temperature of the electric storage apparatus 310 may be the cell temperature of the electric storage apparatus 310, or may be the environmental temperature of the electric storage apparatus 310.

The deterioration rate may be corrected based on the rate of the charge or discharge of the electric storage apparatus 310. The deterioration rate may be corrected so as to increase as the rate of the charge or discharge of the electric storage apparatus 310 is higher.

The deterioration rate may be corrected based on the time of the charge or discharge of the electric storage apparatus 310. The deterioration rate is corrected so as to increase as the time of the charge or discharge of the electric storage apparatus 310 is longer.

In this way, the power management apparatus 200 (controller 230) may correct the deterioration parameter based on at least any one parameter of the charge state of the electric storage apparatus 310, the temperature of the electric storage apparatus 310, the rate of the charge or discharge of the electric storage apparatus 310 and the time of the charge or discharge of the electric storage apparatus 310.

SPECIFIC EXAMPLES OF FIRST EFFECT AND SECOND EFFECT

Specific examples of the first effect and second effect according to the embodiment will be described below.

A case where the discharge is performed from a capacity of 100% to a capacity of 50% in the case where the deterioration cost in one cycle is shown as 1000000 yen× 0.05=500 yen as described above will be discussed. In this case, the deterioration cost associated with the discharge is shown as 500 yen/4=125 yen.

As described above, the deterioration rate may be corrected based on the charge state (for example, a coefficient $\alpha$) of the electric storage apparatus 310, the temperature (for example, a coefficient $\beta$) of the electric storage apparatus 310, the rate (for example, a coefficient $\gamma$) of the discharge of the electric storage apparatus 310, and the time (for example, a coefficient $\theta$) of the discharge of the electric storage apparatus 310. That is, the deterioration cost may be shown as 125 yen×$\alpha$×$\beta$×$\gamma$×$\theta$.

Here, specific examples of the first effect and the second effect will be exemplified focusing on the rate of the discharge of the electric storage apparatus 310. Here, a case where the correction is performed such that the first effect and the second effect increase as the rate of the discharge is higher will be exemplified.

For example, in the case where the rate of the discharge is 100 kW, the second effect (the deterioration cost that is avoided by not operating the electric storage apparatus 310) is corrected to 150 yen, and the first effect is 145 yen. In this case, the second effect is higher than the first effect, and therefore the power management apparatus 200 (controller 230) does not execute the balance control. In the case where the rate of the discharge is 70 kW, the second effect (the deterioration cost that is avoided by not operating the electric storage apparatus 310) is corrected to 140 yen, and the first effect is 138 yen. In this case, the second effect is higher than the first effect, and therefore the power management apparatus 200 (controller 230) does not execute the balance control. In the case where the rate of the discharge is 30 kW, the second effect (the deterioration cost that is avoided by not operating the electric storage apparatus 310) is corrected to 125 yen, and the first effect is 130 yen. In this case, the first effect is higher than the second effect, and therefore the power management apparatus 200 (controller 230) executes the balance control.

That is, the power management apparatus 200 (controller 230) does not execute the balance control in the case where the second effect is higher than the first effect, and executes the balance control in the case where the first effect is higher than the second effect.

Further, the power management apparatus 200 (controller 230) may calculate the first effect and the second effect for each discharge rate of 0 kW to 100 kW, and may decide a discharge rate that maximizes the difference between the first effect and the second effect.

(Power Management Method)

A power management method according to the embodiment will be described below. A flow illustrated in FIG. 5 may be performed based on a predetermined trigger. The predetermined trigger may be that the total power of the one or more facilities 300 exceeds the peak power, may be that the reduction request for the power of forward power flow or the power of reverse power flow is received, or may be that the total power of the one or more facilities 300 deviates from the imbalance power by a predetermined percentage (for example, ±3%) or more.

In step S10, the power management apparatus 200 calculates the first effect. The first effect may be regarded as the incentive that is acquired by the operation of the electric storage apparatus 310, or may be regarded as the penalty that is avoided by the operation of the electric storage apparatus 310. The power management apparatus 200 may correct the first effect based on the rate of the discharge of the electric storage apparatus 310, the time of the discharge of the electric storage apparatus 310, or the like.

In step S20, the power management apparatus 200 calculates the second effect. The second effect may be regarded as the deterioration cost that is avoided by not operating the electric storage apparatus 310. The power management apparatus 200 may correct the deterioration parameter based on at least one parameter of the charge state of the electric storage apparatus 310, the temperature of the electric storage apparatus 310, the rate of the charge or discharge of the electric storage apparatus 310 and the time of the charge or discharge of the electric storage apparatus 310.

In step S30, the power management apparatus 200 determines whether or not the first effect is higher than the second effect. In the case where the determination result is YES, a process of step S40 is performed. In the case where the determination result is NO, a process of step S50 is performed.

In step S40, the power management apparatus 200 executes the balance control of controlling the operation of the electric storage apparatus 310 such that the power of the one or more facilities 300 becomes close to the target power.

In step S50, the power management apparatus 200 does not execute the balance control of controlling the operation of the electric storage apparatus 310 such that the power of the one or more facilities 300 becomes close to the target power.

Although omitted in FIG. 5, the power management apparatus 200 manages at least the utilization state of the electric storage apparatus 310. The utilization state of the electric storage apparatus 310 may be specified based on the message that is received from the EMS 330. In the case where the power management apparatus 200 directly controls the operation of the electric storage apparatus 310 without depending on the EMS 330, the utilization state of the electric storage apparatus 310 may be specified based on the control history of the operation of the electric storage apparatus 310. The step of managing the utilization state may be performed whenever the message is received from the EMS 330, or may be performed whenever the control message is transmitted to the EMS 330.

Action and Effect

In the embodiment, the power management apparatus 200 does not execute the balance control of controlling the operation of the electric storage apparatus 310 such that the power of the one or more facilities 300 becomes close to the target power, in the case where the second effect is higher than the first effect, and executes the balance control in the case where the first effect is higher than the second effect. According to this configuration, in the determination of whether to execute the balance control, the comparison between the first effect that is produced by operating the electric storage apparatus 310 and the second effect that is produced by not operating the electric storage apparatus 310 is performed. Accordingly, the deterioration of the electric storage apparatus 310 is considered, and therefore it is possible to optimize the effect associated with the introduction of the electric storage apparatus 310.

OTHER EXAMPLES

Although the present invention has been described with reference to the above-described embodiments, it should not be understood that the descriptions and drawings forming a part of this disclosure limit the present invention. From this disclosure, various alternative embodiments, examples, and operation techniques will be apparent to those skilled in the art.

Although not particularly mentioned in the embodiment, the power may be an instantaneous power (kW), or may be an integral power amount (kWh) during a certain period (for example, 30 minutes). For example, a power information message may include an information element indicating the instantaneous power (kW), or may include an information element indicating the integral power amount (kWh).

In the embodiment, the case where the power management apparatus manages a plurality of facilities 300 has been exemplified. However, the power management apparatus may mange one facility 300. In this case, the power management apparatus may be the EMS 330.

Although not particularly mentioned in the embodiment, in addition to the electric storage apparatus 310, the facility 300 may include an apparatus that performs power generation using natural energy such as solar light, wind power, water power and geothermal heat, and may include a fuel cell apparatus. The fuel cell apparatus is a solid oxide fuel cell (SOFC), a polymer electrolyte fuel cell (PEFC), a phosphoric acid fuel cell (PAFC), a molten carbonate fuel cell (MCFC), or the like.

In the embodiment, the electric storage apparatus 310 has been exemplified as an object of the balance control. However, the embodiment is not limited to this. The object of the balance control may be another distributed power supply. For example, the object of the balance control may be a fuel cell apparatus. As the deterioration parameter for the fuel cell apparatus, the number of stops of the fuel cell apparatus, the number of starts of the fuel cell apparatus and the like can be used.

In the embodiment, the power management apparatus 200 includes the manager 210. However, the embodiment is not limited to this. The manager 210 may be a cloud server that is provided on the internet.

Although not particularly mentioned in the embodiment, the EMS 330 provided in the facility 300 does not always have to be provided in the facility 300. For example, some of the functions of the EMS 330 may be provided by a cloud server that is provided on the internet. That is, the EMS 330 may be regarded as including the cloud server.

In the embodiment, the case where the first protocol is a protocol complying with Open ADR 2.0 and the second protocol is a protocol complying with ECHONET Lite has been exemplified. However, the embodiment is not limited to this. The first protocol only needs to be a protocol that is standardized as a protocol to be used for the communication between the power management apparatus 200 and the EMS 330. The second protocol only needs to be a protocol that is standardized as a protocol to be used in the facility 300.

The invention claimed is:

1. A power management apparatus comprising:
a manager configured to manage at least a utilization state of an electric storage apparatus; and
a controller configured to execute a balance control of the electric storage apparatus such that a power of one or more facilities becomes close to a target power,
wherein the controller is configured
to compare a first effect and a second effect, the first effect being produced by operating the electric storage apparatus, the second effect being produced by not operating the electric storage apparatus, and
not to execute the balance control in a case where the second effect is higher than the first effect, and to execute the balance control in a case where the first effect is higher than the second effect wherein the first effect is an incentive obtained by operating the electric storage apparatus, and the second effect is a deterioration cost avoided by not operating the electric storage apparatus.

2. The power management apparatus according to claim 1, wherein the controller is configured to calculate the second effect based on a deterioration parameter associated with charge or discharge of the electric storage apparatus and an introduction cost for the electric storage apparatus.

3. The power management apparatus according to claim 1, wherein the controller is configured to calculate the first effect based on a difference between the power of the one or more facilities and the target power, the difference being realized by operating the electric storage apparatus.

4. The power management apparatus according to claim 1, wherein the target power is set based on a peak power that is permitted for the one or more facilities.

5. The power management apparatus according to claim 1, wherein the target power is set based on at least one of a reduction request for a power of forward power flow to the one or more facilities or a reduction request for a power of reverse power flow from the one or more facilities.

6. The power management apparatus according to claim 1, wherein the target power is set by a previously determined imbalance plan.

7. The power management apparatus according to claim 1, wherein
the controller is configured to correct the first effect based on a rate of a discharge of the electric storage apparatus or a time of the discharge of the electric storage apparatus.

8. The power management apparatus according to claim 1, wherein
the controller is configured to correct the deterioration cost based on at least one parameter of
a charge state of the electric storage apparatus,
a temperature of the electric storage apparatus,
a rate of the charge or discharge of the electric storage apparatus, or
a time of the charge or discharge of the electric storage apparatus.

9. The power management apparatus according to claim 1, wherein the controller is configured to compare the first effect with the second effect by using price values of the first effect and the second effect.

10. The power management apparatus according to claim 2, wherein the controller is configured to correct the deterioration parameter based on at least one parameter of a charge state of the electric storage apparatus, a temperature of the electric storage apparatus, a rate of the charge or discharge of the electric storage apparatus, or a time of the charge or discharge of the electric storage apparatus.

11. A power management system comprising:
a manager configured to manage at least a utilization state of an electric storage apparatus; and
a controller configured to execute a balance control of the electric storage apparatus such that a power of one or more facilities becomes close to a target power,
wherein
the controller is configured
to compare a first effect and a second effect, the first effect being produced by operating the electric storage apparatus, the second effect being produced by not operating the electric storage apparatus, and not to execute the balance control in a case where the second effect is higher than the first effect, and to execute the balance control in a case where the first effect is higher than the second effect wherein the first effect is an incentive obtained by operating the electric storage apparatus, and the second effect is a deterioration cost avoided by not operating the electric storage apparatus.

12. A power management method, comprising:

managing at least a utilization state of an electric storage apparatus;

comparing a first effect and a second effect, the first effect being produced by operating the electric storage apparatus, the second effect being produced by not operating the electric storage apparatus; and not executing a balance control of the electric storage apparatus such that a power of one or more facilities becomes close to a target power, in a case where the second effect is higher than the first effect, and executing the balance control in a case where the first effect is higher than the second effect wherein the first effect is an incentive obtained by operating the electric storage apparatus, and the second effect is a deterioration cost avoided by not operating the electric storage apparatus.

* * * * *